(12) United States Patent
Behrends et al.

(10) Patent No.: US 7,714,630 B2
(45) Date of Patent: May 11, 2010

(54) METHOD AND APPARATUS TO LIMIT CIRCUIT DELAY DEPENDENCE ON VOLTAGE

(75) Inventors: Derick G. Behrends, Rochester, MN (US); Todd A. Christensen, Rochester, MN (US); Travis R. Hebig, Rochester, MN (US); Daniel M. Nelson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 12/138,564

(22) Filed: Jun. 13, 2008

(65) Prior Publication Data

US 2009/0309644 A1  Dec. 17, 2009

(51) Int. Cl.
*H03H 11/26* (2006.01)
(52) U.S. Cl. .................. 327/278; 327/261; 327/263; 327/291
(58) Field of Classification Search ......... 327/261–264, 327/269–271, 276–278, 284, 285, 291, 299, 327/303
See application file for complete search history.

(56) References Cited

U.S. PATENT DOCUMENTS

| 5,459,423 | A | 10/1995 | Nozawa et al. |
| 6,130,567 | A | 10/2000 | Kobayashi |
| 6,333,652 | B1 * | 12/2001 | Iida et al. ................... 327/284 |
| 2001/0054925 | A1 * | 12/2001 | Dally et al. ................. 327/276 |

* cited by examiner

*Primary Examiner*—Long Nguyen
(74) *Attorney, Agent, or Firm*—Suiter Swantz PC LLO

(57) ABSTRACT

The present disclosure is an apparatus for generating a decreasing delay with increasing input voltage to a predetermined voltage value at which point the delay may remain constant. The apparatus may include a circuit comprising a voltage regulator receiving an input voltage and two paths of inverters. At least two paths of inverters may be coupled to an input signal, the input signal may be low voltage (e.g. 0) or high voltage (e.g. 1). A first path may be referenced to a reference voltage while the second path may be referenced to the input voltage. The apparatus may include logic gates for receiving the output of each of the first path of inverters and the output of the second path of inverters to generate a desired output. As the input voltage increases, delay of the apparatus may decrease until the input voltage is approximately the same voltage as the reference voltage, at which the delay may remain constant.

1 Claim, 5 Drawing Sheets

METHOD AND APPARATUS TO LIMIT CIRCUIT DELAY DEPENDENCE ON VOLTAGE

TECHNICAL FIELD

The present disclosure generally relates to the field of electrical circuits and more particularly to a method and apparatus that limits delay dependence with respect to voltage.

BACKGROUND

Power supply voltage is often determined after integrated circuit processing is complete. Voltage is tuned to optimize power and performance. Increasing voltage reduces delay, increases performance, but also increases power. There are many circuits, such as pulse generators and dynamic circuits, where some delay dependence on voltage is desired, but the circuits lose functionality if some delays in critical paths are reduced too far. These delays can cause an otherwise good chip to be discarded because the chip does not meet power, performance, and functionality specifications.

SUMMARY

The present disclosure is directed to an apparatus for generating a decreasing delay with increasing input voltage to a predetermined voltage value at which point the delay may remain constant. An apparatus may include a circuit comprising a voltage regulator receiving an input voltage and two paths of inverters. At least two paths of inverters may be coupled to an input signal, the input signal may be low voltage (e.g. 0) or high voltage (e.g. 1). A first path may be referenced to a reference voltage while the second path may be referenced to the input voltage. The apparatus may include logic gates for receiving the output of each of the first path of inverters and the output of the second path of inverters to generate a desired output. As the input voltage increases, delay of the apparatus may decrease until the input voltage is approximately the same voltage as the reference voltage, at which the delay may remain constant.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

The present disclosure is directed to an apparatus for generating a decreasing delay with increasing input voltage to a predetermined voltage value at which point the delay remains constant. An apparatus may include a circuit comprising a voltage regulator receiving an input voltage and two paths of inverters. At least two paths of inverters may be coupled to an input signal, the input signal may be low voltage (e.g. 0) or high voltage (e.g. 1). A first path may be referenced to a reference voltage while the second path may be referenced to the input voltage. The apparatus may include logic gates for receiving the output of each of the first path of inverters and the output of the second path of inverters to generate a desired output. As the input voltage increases, delay of the apparatus may decrease until the input voltage is approximately the same voltage as the reference voltage, at which the delay may remain constant.

The apparatus for generating a decreasing delay with increasing input voltage may operate with low-to-high and high-to-low input transitions. This apparatus may be suitable for use in critical timing paths in integrated circuits that have minimum delay requirements. Examples of these paths include pulse generators for sense amp set signals and word-line pulse widths in SRAM arrays and some dynamic logic circuits.

Figure 1:
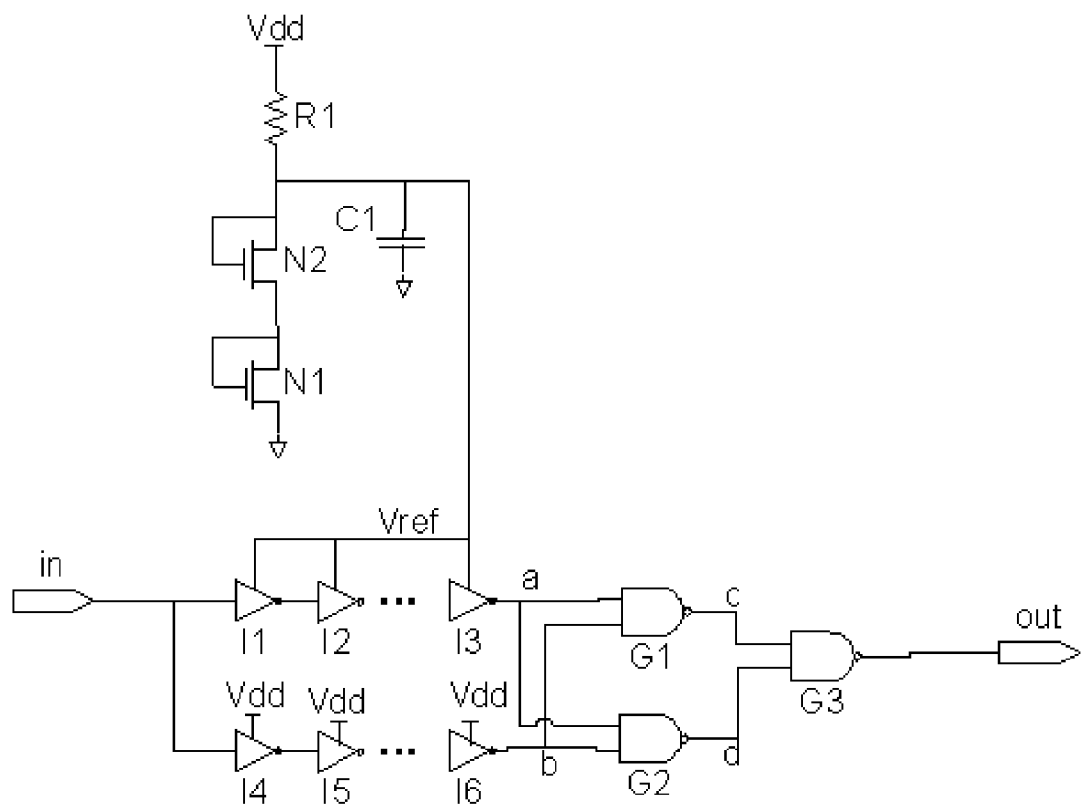
FIG. 1 is a diagram illustrating a circuit to limit circuit delay dependence on voltage.
Figure 5:
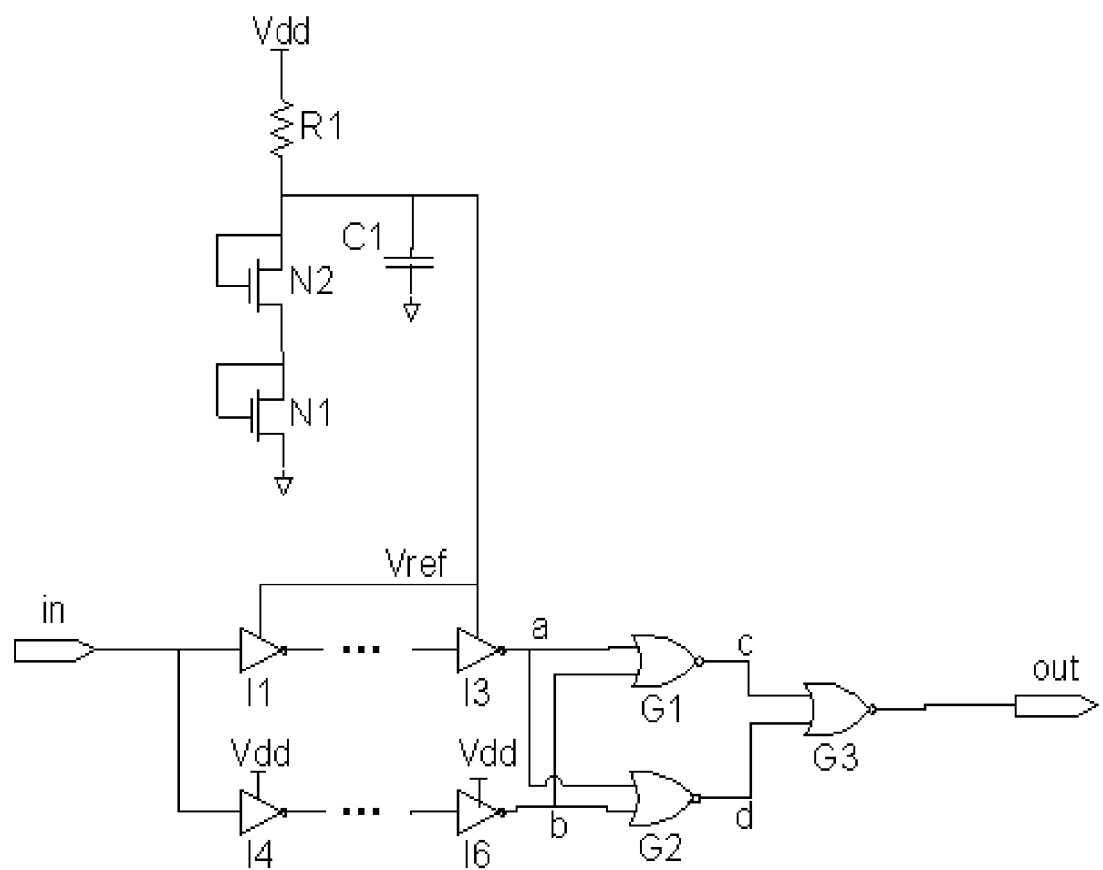
FIG. 5 is a diagram illustrating alternate embodiment using non-inverting inverter delay paths and NOR gates.

Referring to FIG. 1 the circuit may use two delay paths, each path may include a plurality of inverters. A first path may be Path I1-I3 and a second path may be Path I4-I6. Depending on the application and requirements, these paths may contain any number of inverters; however, a first path may include a different number of inverters than the second path. P I4-I6 may be connected to input voltage (Vdd), whereas delay path I1-I3 may be connected to a reference (Vref). In the embodiment shown in FIG. 1, circuit may include a voltage regulator. The voltage regulator may receive an input voltage (Vdd) and produce a reference voltage. The voltage regulator may include two transistors (N1 and N2), a resistor (R1) and a capacitor (C1). The reference voltage may be set to a value of two transistor threshold voltages above ground. Other types of voltage regulators may also be employed. The value of reference voltage and the number of inverters in each path are varied to determine the voltage threshold at which the delay through the circuit is no longer reduced with increasing input voltage. The output of these delay paths may be connected to logic gates, such as NAND gates G1 and G2. The output of NAND gates G1 and G2 may be connected to NAND gate G3. The output of G3 may be the output of the circuit. Referring to FIG. 5, an alternate embodiment of a circuit using non-inverting inverter delay paths and the logic gates may be NOR gates to achieve the desired results is shown.

Referring to FIG. 1, the circuit operates as follows for a 0→1 transition at the input:

'in' is initially low. 'a' and 'b' are both initially high. 'c' and 'd' are initially low and 'out' is initially high. 'in' goes high making 'a' and 'b' go low. Since both 'a' and 'b' must go low to make 'c' and 'd' go high, the longer of the two delay paths I1-I3 or I4-I6 determines when 'out' goes low.

Referring to FIG. 1, the circuit operates as follows for a 1→0 transition at the input:

'in' is initially high. 'a' and 'b' are both initially low. 'c' and 'c' are initially high, and 'out' is initially low. 'in' goes low making 'a' and 'b' go high and 'c' and 'd' go low. Since both 'c' and 'd' must go low to make the 'out' go high the longer of the two delay paths I1-I3 or I4-I6 determines when 'out' goes low.

Figure 2:
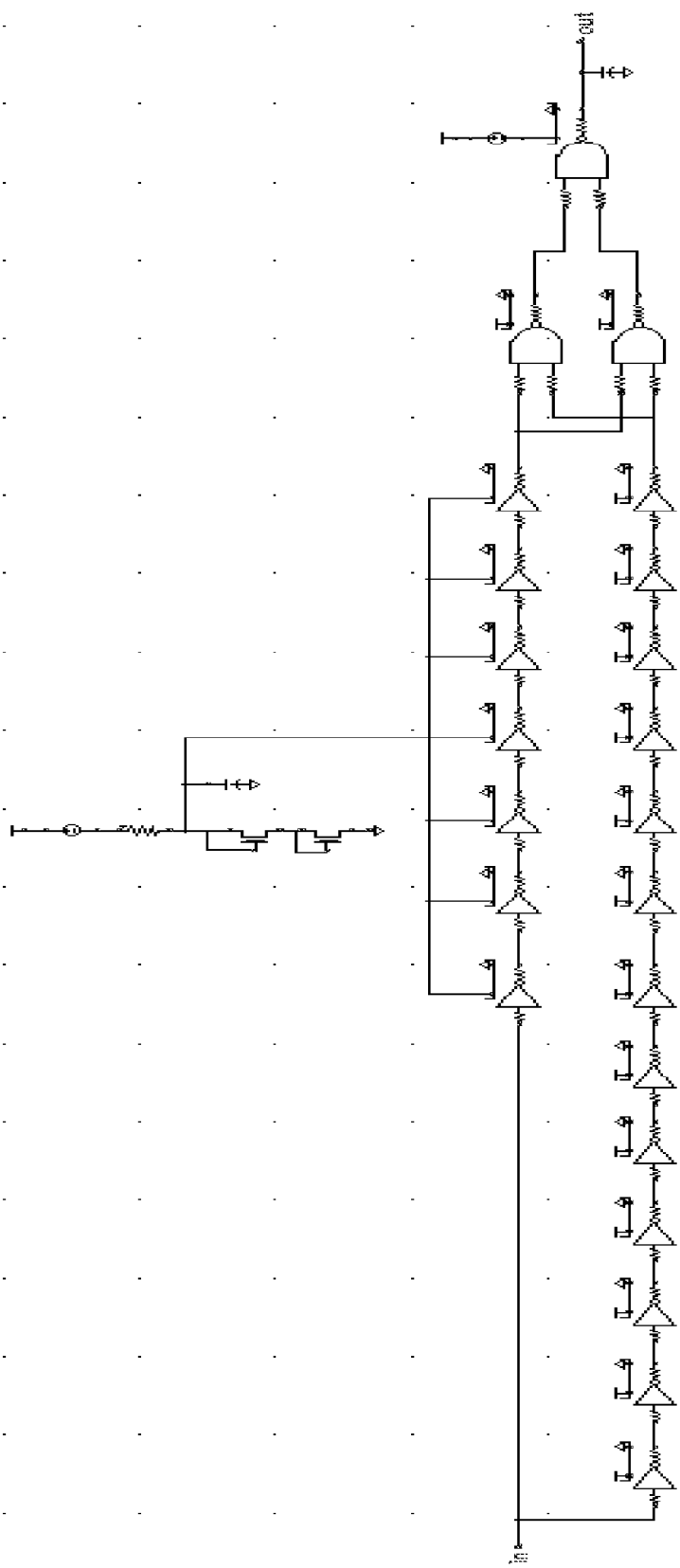
FIG. 2 is a diagram illustrating one embodiment of the simulated circuit.
Figure 3:
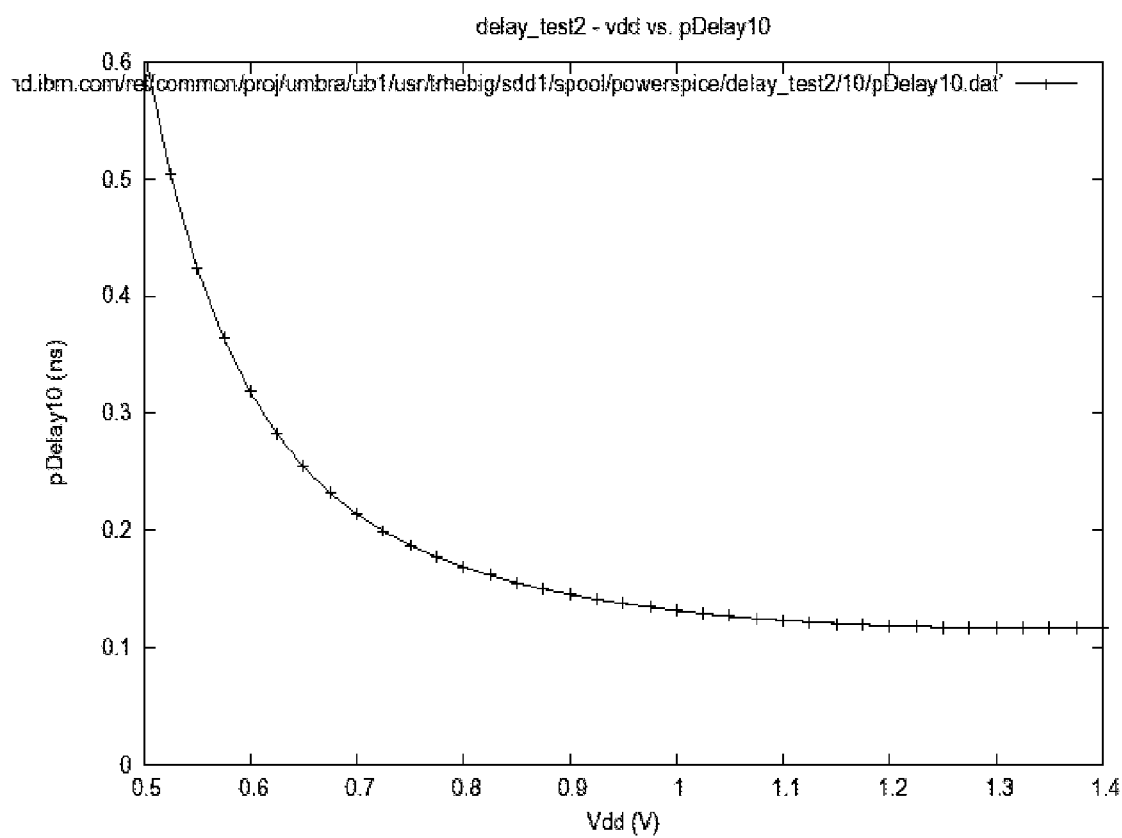
FIG. 3 is a diagram illustrating the results of simulations to determine delay of the total circuit delay for a high-to-low input transition at various voltages.
Figure 4:
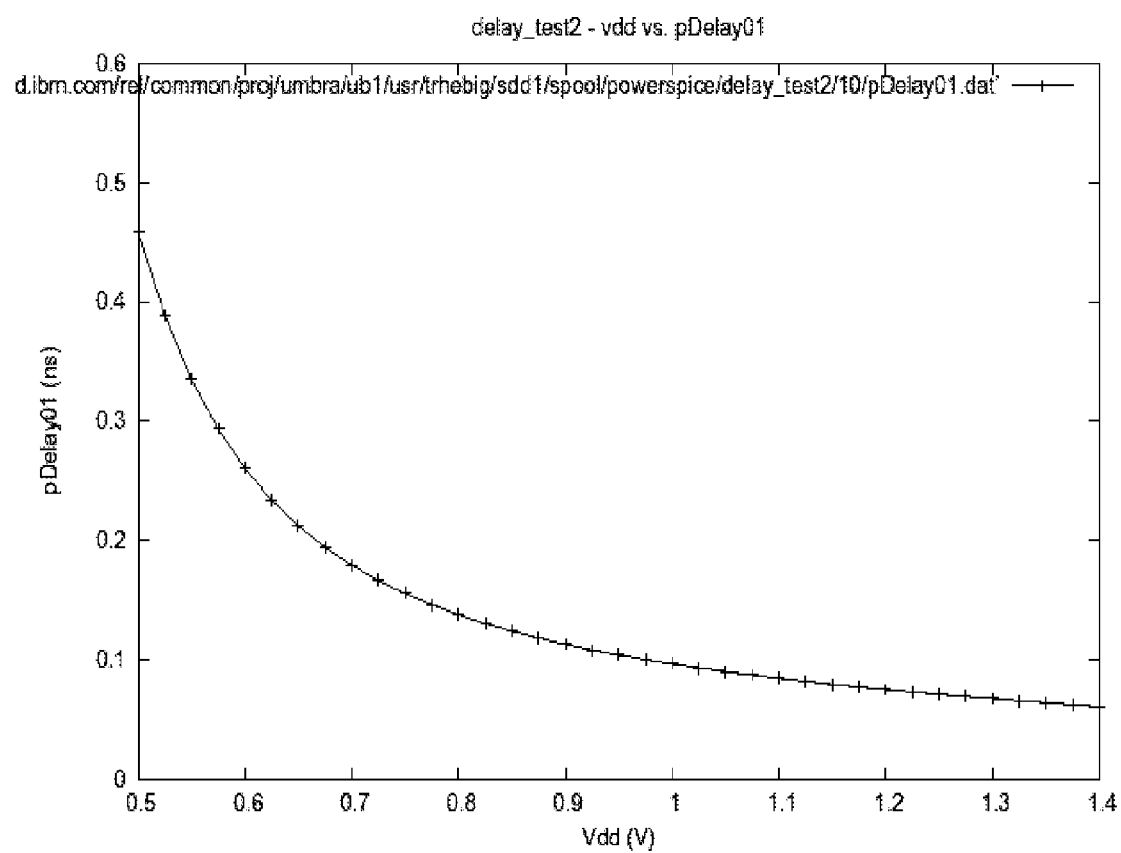
FIG. 4 is a diagram illustrating results of simulations done to determine delay of the total circuit delay for a low-to-high input transition at various voltages.

Circuit variables may include reference voltage and the number of inverters in each path. Referring to FIG. 2, the number of inverters of each path may be varied to achieve a desired result. These variables determine the voltage threshold at which the circuit delay no longer reduces with increasing input voltage.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An apparatus, comprising:
   a voltage regulator, said voltage regulator receiving an input voltage and producing a reference voltage;
   a first path of inverters, said first path of inverters including a first number of inverters, each inverter of said first path of inverters being coupled to said reference voltage, a first inverter of said first path of inverters being coupled to an input;
   a second path of inverters, said second path of inverters including a second number of inverters, said second number of inverters being greater than said first number of inverters, each inverter of said second path of inverters being coupled to said input voltage, a first inverter of said second path of inverters being coupled to said input; and
   at least one logic gate receiving an output of said first path of inverters and an output of said second path of inverters to produce an output based upon a value of said input,
   wherein said apparatus generates a delay that decreases as said input voltage is increased until said input voltage reaches a predetermined voltage, said delay remaining approximately constant when said input voltage is greater than said predetermined voltage.

* * * * *